US009397681B2

(12) United States Patent
Karner

(10) Patent No.: US 9,397,681 B2
(45) Date of Patent: Jul. 19, 2016

(54) ANALOG/DIGITAL CONVERTER SYSTEM AND ASSOCIATED METHOD FOR CHECKING A MULTIPLEXER FOR AN ANALOG/DIGITAL CONVERTER

(71) Applicant: Ruediger Karner, Kornwestheim (DE)

(72) Inventor: Ruediger Karner, Kornwestheim (DE)

(73) Assignee: ROBERT BOSCH GMBH, Stuttgart (DE)

( * ) Notice: Subject to any disclaimer, the term of this patent is extended or adjusted under 35 U.S.C. 154(b) by 0 days.

(21) Appl. No.: 14/383,783

(22) PCT Filed: Jan. 24, 2013

(86) PCT No.: PCT/EP2013/051312
§ 371 (c)(1),
(2) Date: Sep. 8, 2014

(87) PCT Pub. No.: WO2013/131685
PCT Pub. Date: Sep. 12, 2013

(65) Prior Publication Data
US 2015/0102950 A1    Apr. 16, 2015

(30) Foreign Application Priority Data
Mar. 8, 2012    (DE) .......................... 10 2012 203 670

(51) Int. Cl.
*H03M 1/10*    (2006.01)
*H03M 1/12*    (2006.01)
*H03M 1/00*    (2006.01)

(52) U.S. Cl.
CPC .......... *H03M 1/1071* (2013.01); *H03M 1/1076* (2013.01); *H03M 1/122* (2013.01); *H03M 1/1205* (2013.01); *H03M 1/00* (2013.01); *H03M 1/12* (2013.01)

(58) Field of Classification Search
CPC ................................. H03M 1/12; H03M 1/00
USPC .................................. 341/120, 155, 156, 118
See application file for complete search history.

(56) References Cited

U.S. PATENT DOCUMENTS

| 6,396,426 | B1* | 5/2002 | Balard ................ H03M 1/1076 |
| | | | 341/120 |
| 2007/0252744 | A1 | 11/2007 | Takeuchi |
| 2010/0235699 | A1 | 9/2010 | Terae et al. |

FOREIGN PATENT DOCUMENTS

| DE | 10 2008 042400 | 4/2010 |
| EP | 1 641 126 | 3/2006 |
| JP | 2007309773 A | 11/2007 |

OTHER PUBLICATIONS

Utley et al : "Checking Circuit for Analog Input Systems", Computer Design, Pennwell Publ. Littleton, Massachusetts, US, vol. 12, No. 12, Dec. 1973, p. 106, XP002107327, ISSN : 00104566.

*Primary Examiner* — Joseph Lauture
(74) *Attorney, Agent, or Firm* — Norton Rose Fulbright US LLP

(57) ABSTRACT

An analog/digital converter system includes a multiplexer, which includes multiple channels having at least one switch, and an analog/digital converter, the analog input of which is connected to the output portal of the multiplexer. Also described is a method for checking a multiplexer for an analog/digital converter. At least one other switch for testing the multiplexer is provided in at least one channel, this other switch connecting the input portal and/or the output portal of the corresponding channel and/or the corresponding channel to a predefined voltage potential.

13 Claims, 16 Drawing Sheets

ANALOG/DIGITAL CONVERTER SYSTEM AND ASSOCIATED METHOD FOR CHECKING A MULTIPLEXER FOR AN ANALOG/DIGITAL CONVERTER

FIELD OF THE INVENTION

The present invention is directed to an analog/digital converter system and to an associated method for checking a multiplexer for an analog/digital converter.

BACKGROUND INFORMATION

A multiplexer is frequently connected upstream from an analog/digital converter for the purpose of converting analog signals from multiple inputs into corresponding digital signals with the aid of a single analog/digital converter. A possible error of the multiplexer, such as a short circuit to another potential, a coupling of multiple channels among one another or an interruption in one of the channels, is not recognized. In order to be able to use such an analog/digital converter system including a multiplexer and an analog/digital converter for safety-relevant variables, a check for reliability is required. The analog/digital converter system may, for example, be configured as a part of a sensor system which may be implemented as an ASIC (application-specific integrated circuit).

The presently common methods carry out the check of the multiplexer, if at all, with the aid of a plurality of instructions and a software program which is processed by a microcontroller in a corresponding control device. Here, the program sequence must then still wait for the operations of the ASIC to be processed before the next program step for checking may be initiated. This results in a great software complexity and in long waiting times of the microcontroller, which often remain unused, during the test phase.

In the unexamined patent application DE 10 2008 042 400 A1, for example, a method and a correction device for correcting an offset error of an analog/digital converter system are discussed. The correction device described above includes a multiplexer for connecting an input of an analog/digital converter to at least one measuring channel or an offset channel. The offset channel provides a predefined reference voltage level or a predefined reference current value. An arithmetic unit stores in a memory a value which is provided by an output of the analog/digital converter as the offset value or links a value which is provided by the output of the analog/digital converter as a measured value to the stored offset value on the basis of a linking structure and provides the obtained value as the corrected measured value to a transmission unit. Furthermore, a control unit is provided which switches the multiplexer and the arithmetic unit into a first or a second operating mode, in the first operating mode, the input of the analog/digital converter being connected to the offset channel and the value provided by the output of the analog/digital converter being interpreted in the arithmetic unit as an offset error value, and in the second operating mode, the input of the analog/digital converter being connected to a measuring channel and the value provided by the output being interpreted in the arithmetic unit as a measured value.

SUMMARY OF THE INVENTION

The analog/digital converter system according to the present invention having the features described herein and the method according to the present invention for checking a multiplexer for an analog/digital converter have the advantage over the related art that a multiplexer of an analog/digital converter may be tested automatically within the analog/digital converter system. This means that an automatically running sequence control, which activates and evaluates the individual testing conditions for the multiplexer, may be activated within the analog/digital converter system via a software instruction, which is output by a control device, for example, thus making a comprehensive check of the complete analog/digital converter system possible. The result of the check may then be retrieved from a control device via a software instruction.

The basic idea of the present invention is based on a complex logic circuit which is situated in the analog/digital converter system and is able to carry out simple sequence controls, thus making it possible to initiate, in reaction to a software instruction, a test mode which tests whether the individual input portals of the channels of the multiplexer are short-circuited to ground or to another potential and/or whether the individual channels of the multiplexer have an internal short circuit to another voltage potential and/or are coupled to another channel.

The logic circuit may carry out different measurements during the test mode in order to detect whether the individual channels of the multiplexer have internal and/or external short circuits to other voltage potentials. Furthermore, the logic circuit may carry out different measurements in order to detect whether multiple channels of the multiplexer are coupled, which would result in unnoticed erroneous measurements. During the coupling tests, two loops are processed which are nested into one another, a differentiation being made between stimuli channels and measuring channels. A predefined voltage potential is applied to and measured at a stimuli channel and the measuring channels are only used for measuring. During the internal coupling tests, the particular stimuli channel is connected to an internal voltage potential, and during the external coupling tests, an external voltage potential is applied to the input portal of the particular stimuli channel. The results of the individual test series may be stored and output upon request. Since all tests or measurements run automatically after the initiation of the test mode by the software instruction, the corresponding control device or the microcontroller in the corresponding control device is not affected by all the tests or measurements and is able to process other processes during this time. After the automatic test mode has been terminated, the measuring results may then be retrieved if necessary.

Specific embodiments of the present invention provide an analog/digital converter system having a multiplexer which includes multiple channels having at least one switch and an analog digital converter, the analog input of which is connected to the output portal of the multiplexer. According to the present invention, at least one other switch for testing the multiplexer is provided in at least one channel, this other switch connecting the input portal and/or the output portal of the corresponding channel and/or the corresponding channel to a predefined voltage potential.

Furthermore, a method for checking a multiplexer for an analog/digital converter is provided, the multiplexer including multiple channels which have at least one switch, which are switched, and which connect an input portal of the particular channel to a corresponding output portal. According to the present invention, at least one other switch for testing the multiplexer is provided in at least one channel, the input portal and/or the output portal of the corresponding channel and/or the corresponding channel being connected to a predefined voltage potential with the aid of this other switch.

Advantageous improvements of the analog/digital converter system described herein and of the method described herein for checking a multiplexer for an analog/digital converter are possible with the aid of the measures and refinements listed in the further descriptions herein.

It is particularly advantageous that the system according to the present invention includes a logic circuit which switches the at least one switch and the at least one other switch of a particular channel and connects an input portal of the channel to a corresponding output portal, and that in the logic circuit, a sequence control may be implemented which checks the individual channels in a predefined sequence by activating the corresponding switches to the effect as to whether the particular channel has an internal and/or external short circuit to another voltage potential and/or is coupled to another channel. The at least one other switch may be switched in a test mode, the sequence control being activated in the logic circuit during the test mode.

In one advantageous embodiment of the analog/digital converter system according to the present invention, a voltage supply and a selection unit may be provided for the purpose of providing at least one predefined external voltage potential. The voltage supply may, for example, provide multiple reference voltage levels which may be used to check the multiplexer and the analog/digital converter. The voltage supply, for example, provides a first reference voltage level, which is converted into a maximum digital value by the analog/digital converter; a second reference voltage level which is converted into a digital value, which corresponds to approximately 75% of the maximum value, by the analog/digital converter; a third reference voltage level which is converted into a digital value, which corresponds to approximately 50% of the maximum value, by the analog/digital converter; and a fourth reference voltage level which is converted into a digital value, which corresponds to approximately 25% of the maximum value, by the analog/digital converter. A ground potential may be additionally provided. The selection of the individual reference voltage levels may then take place through the selection unit.

In another advantageous embodiment of the analog/digital converter system according to the present invention, the logic circuit may use the analog/digital converter as a measuring element which may ascertain the resulting voltage potential at the output portal of the multiplexer based on criteria which may be predefined by the sequence control. These criteria may, for example, include certain switching states of the switches in the multiplexer or in the selection unit.

In another advantageous embodiment of the analog/digital converter system according to the present invention, the logic circuit may evaluate the resulting voltage potential ascertained at the output portal of the multiplexer based on predefined criteria which are predefined by the sequence control. These predefined evaluation criteria may, for example, include threshold values, value ranges, etc., with which the ascertained, resulting voltage potentials are compared. The logic circuit may compare the resulting voltage potential ascertained at the output portal of the multiplexer with at least one predefined threshold value, for example, and store the comparison result in at least one memory. In order to determine whether the ascertained, resulting voltage potential is within a predefined value range, the logic circuit checks, for example, whether the ascertained, resulting voltage potential exceeds a first threshold value and, simultaneously, falls below a second threshold value, the two threshold values representing the limits of the value range.

In another advantageous embodiment of the analog/digital converter system according to the present invention, the logic circuit may output the comparison result which is stored in at least one memory upon request. In this way, the analog/digital converter system according to the present invention may, for example, have an interface unit to a control device, the interface unit receiving at least one instruction from the control device to carry out the test mode and/or to output the test result and relaying it to the logic circuit. The interface unit may receive the instruction to carry out the test mode in the case of every start-up of the overall system. In this way, it may be ensured, so to speak, for every operation of the analog/digital converter system according to the present invention that the multiplexer works error-free.

In one advantageous embodiment of the method according to the present invention, a sequence control may be implemented which checks the individual channels in a predefined sequence by activating the corresponding switches to the effect as to whether the particular channel has an internal and/or an external short circuit to another voltage potential and/or is coupled to another channel. The at least one other switch may be switched in a test mode, the sequence control being activated in the logic circuit during the test mode.

In another advantageous embodiment of the method according to the present invention, one of the channels may be operated as a stimuli channel and the remaining channels may be operated as measuring channels, the individual channels being operated consecutively as a stimuli channel.

Exemplary embodiments of the present invention are illustrated in the drawings and explained in greater detail in the description below. In the drawings, identical reference numerals refer to components or elements which carry out identical or analog functions.

DETAILED DESCRIPTION

Figure 1:
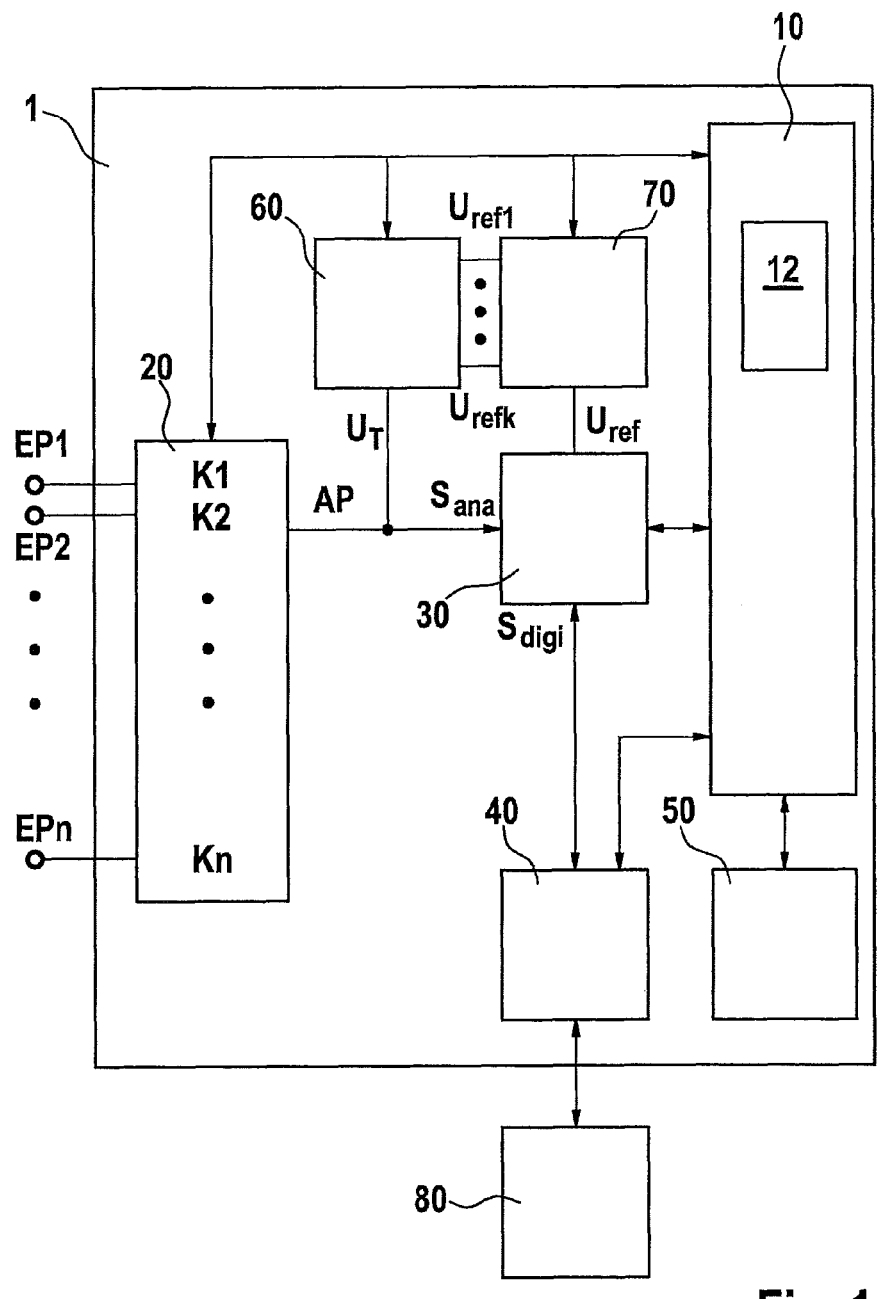
FIG. 1 shows a schematic block diagram of one exemplary embodiment of an analog/digital converter system according to the present invention including a multiplexer and an analog/digital converter.
Figure 2:
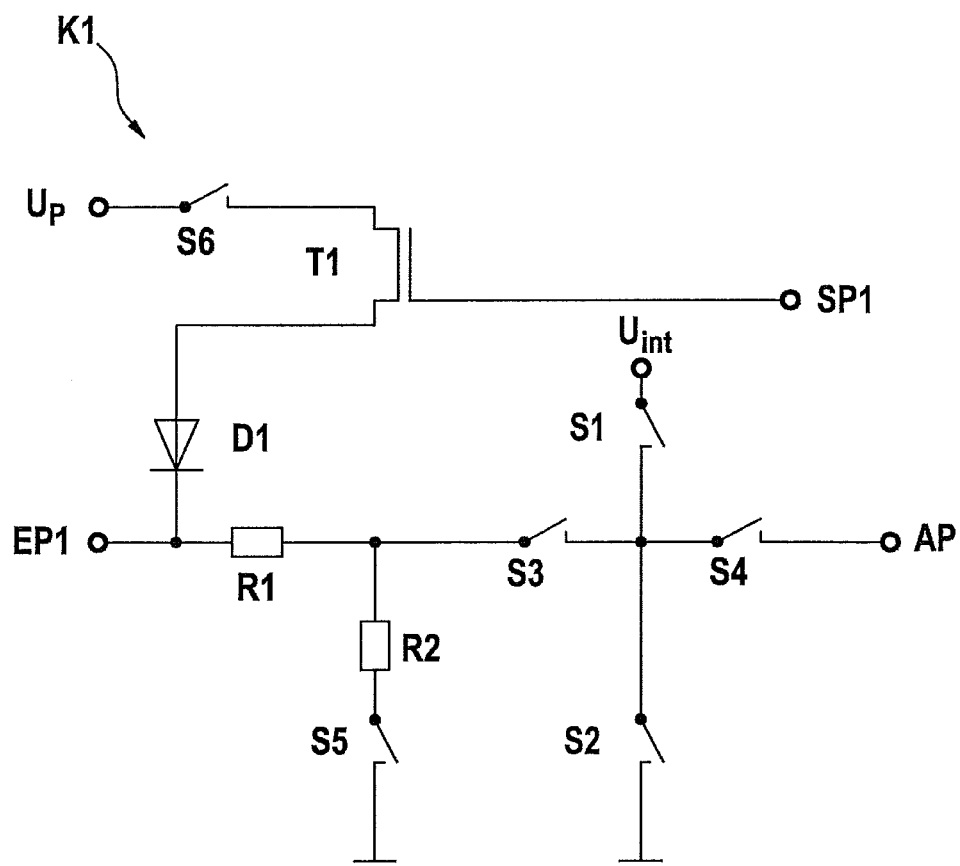
FIG. 2 shows a schematic wiring diagram of a channel of the multiplexer from FIG. 1.
Figure 3:
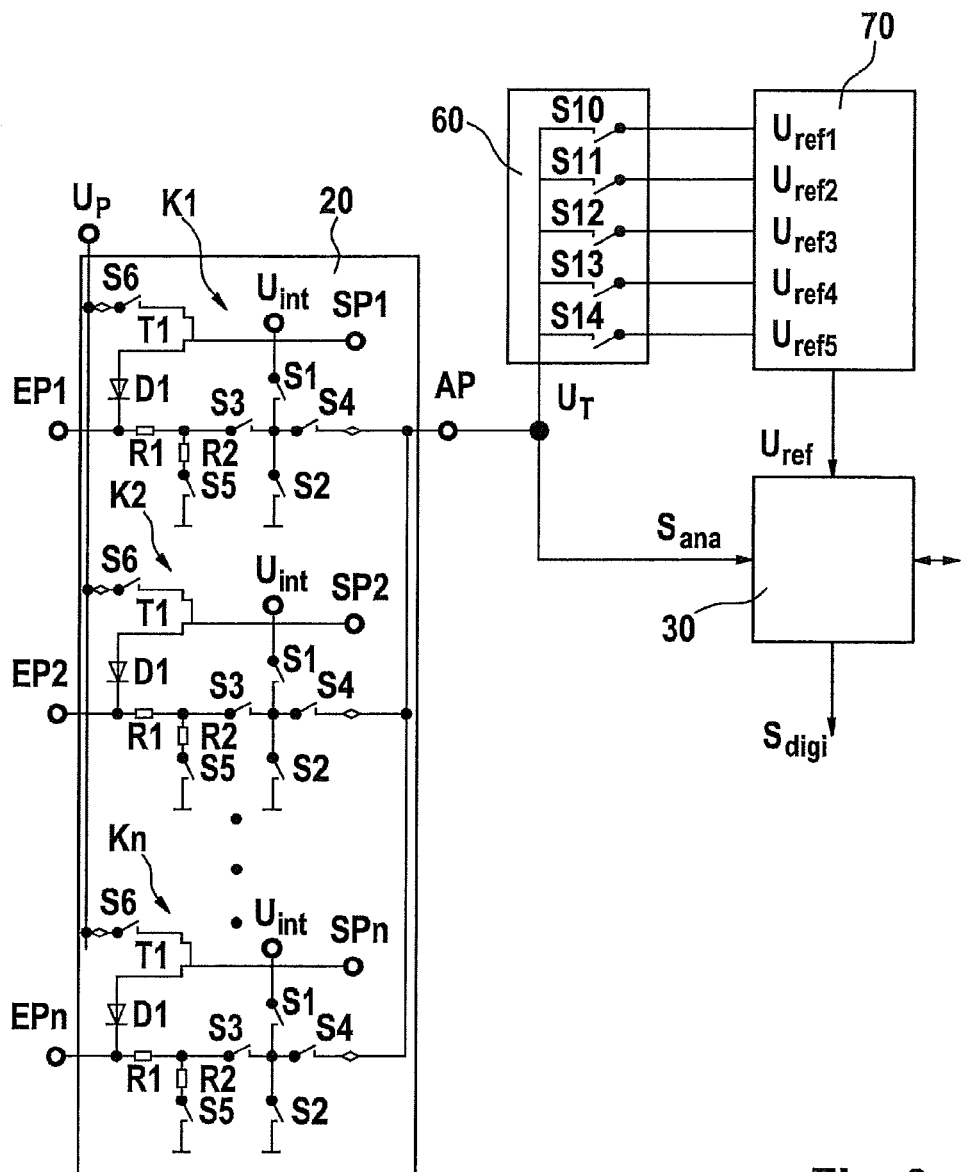
FIG. 3 shows a schematic wiring diagram of a section of the analog/digital converter system according to the present invention from FIG. 1 including the multiplexer, the analog/digital converter, a voltage supply, and a selection unit.

As is apparent from FIGS. 1 through 3, the illustrated exemplary embodiment of an analog/digital converter system 1 according to the present invention includes a multiplexer 20, which includes multiple channels K1 through Kn having at least one switch S3, S4, S5, a logic circuit 10, which switches the at least one switch S3, S4, S5, of a particular channel K1 through Kn, and connects an input portal EP1 through EPn of channel K1 through Kn to a corresponding output portal AP, and an analog/digital converter 30, analog input $S_{ana}$ of which is connected to output portal AP of multiplexer 20.

According to the present invention, at least one other switch S1, S2, S6 for testing multiplexer 20 may be provided in at least one channel K1 through Kn, this other switch connecting input portal EP1 through EPn and/or output portal AP of corresponding channel K1 through Kn and/or corresponding channel K1 through Kn to a predefined voltage potential $U_{int}$, $U_P$, ground, $U_T$. The at least one other switch S1, S2, S6 may be switched with the aid of a logic circuit 10 during test mode.

For this purpose, a sequence control 12 is implemented in logic circuit 10 in the illustrated exemplary embodiment which is activated during a test mode and checks individual channel K1 through Kn in a predefined sequence by activating corresponding switches S1, S2, S3, S4, S5, S6 to the effect as to whether particular channel K1 through Kn has an internal and/or an external short circuit to another voltage potential and/or is coupled to another channel K1 through Kn.

As is furthermore apparent from FIG. 1, analog/digital converter system 1 includes a voltage supply 70 and a selection unit 60 for providing at least one predefined external voltage potential $U_T$, a memory 50 for storing the test results, and an interface unit 40 to a control device 80, the interface unit receiving at least one instruction from control device 80 to carry out a test mode and/or to output the test result and relaying it to logic circuit 10. During normal operation, interface unit 40 additionally outputs a digital signal, which is provided by analog/digital converter 30 at digital output $S_{digi}$, to control device 80. Interface unit 40 may receive the instruction to carry out the test mode in the case of every start-up of the overall system, for example. Voltage supply 70 may, for example, provide multiple reference voltage levels $U_{ref1}$ through $U_{refk}$ which may be used to check multiplexer 20 and analog/digital converter 30. Logic circuit 10 uses selection unit 60 to select one of reference voltage levels $U_{ref1}$ through $U_{refk}$ as test voltage $U_T$ and connects selected reference voltage level $U_{ref1}$ through $U_{refk}$ to output portal AP of multiplexer 20 or analog input $S_{ana}$ of analog/digital converter 30. At the same time, voltage supply 70 provides analog/digital converter 30 with an additional reference voltage $U_{ref}$.

FIG. 2 shows a first channel K1 as an example of all channels K1 through Kn of multiplexer 20. As is furthermore apparent from FIG. 2, illustrated first channel K1 includes a first input portal EP1, an output portal AP, and multiple switches S1, S2, S3, S4, S5, and S6 which are activatable by logic circuit 10. First channel K1 may be connected to an internal voltage potential $U_{int}$ via a first switch S1, and first channel K1 may be connected to a ground potential via a second switch S2. First input portal EP1 may be connected to output portal AP via a third switch S3 and a fourth switch S4. In the illustrated exemplary embodiment, a first resistor R1 is looped into the signal path between first input portal EP1 and output portal AP for current limiting purposes. To stabilize the signal, a voltage divider which includes a second resistor R2 in addition to first resistor R1 may be activated via a fifth switch S5. First input portal EP1 may be connected to a port supply voltage $U_P$ via a transistor T1, which is controllable by a control portal SP1, a sixth switch S6, and a diode D1. In order to connect input portal EP1 to output portal AP, switches S3, S4, and S5 are switched or closed.

As is furthermore apparent from FIG. 3, voltage supply 70 provides selection unit 60 in the illustrated exemplary embodiment with five reference voltage levels $U_{ref1}$ through $U_{ref5}$ for selection purposes. A first reference voltage level $U_{ref1}$ corresponds, for example, to an analog signal which is converted by analog/digital converter 30 into a maximum digital value. First reference voltage level $U_{ref1}$ may be connected for testing purposes by selection unit 60 to output portal AP of multiplexer 20 or to analog input $S_{ana}$ of analog/digital converter 30 by closing a first selection switch S10. A second reference voltage level $U_{ref2}$ corresponds, for example, to an analog signal which is converted by analog/digital converter 30 into a digital value which corresponds to approximately 75% of the maximum value. Second reference voltage level $U_{ref2}$ may be connected for testing purposes by selection unit 60 to output portal AP of multiplexer 20 or to analog input $S_{ana}$ of analog/digital converter 30 by closing a second selection switch S11. A third reference voltage level $U_{ref3}$ corresponds, for example, to an analog signal which is converted by analog/digital converter 30 into a digital value which corresponds to approximately 50% of the maximum value. Third reference voltage level $U_{ref3}$ may be connected for testing purposes by selection unit 60 to output portal AP of multiplexer 20 or to analog input $S_{ana}$ of analog/digital converter 30 by closing a third selection switch S12. A fourth reference voltage level $U_{ref4}$ corresponds, for example, to an analog signal which is converted by analog/digital converter 30 into a digital value which corresponds to approximately 25% of the maximum value. Fourth reference voltage level $U_{ref4}$ may be connected for testing purposes by selection unit 60 to output portal AP of multiplexer 20 or to analog input $S_{ana}$ of analog/digital converter 30 by closing a fourth selection switch S13. A fifth reference voltage level $U_{ref5}$ corresponds, for example, to a ground potential and may be connected for testing purposes by selection unit 60 to output portal AP of multiplexer 20 or to analog input $S_{ana}$ of analog/digital converter 30 by closing a fifth selection switch S14.

As is furthermore apparent from FIGS. 1 through 3, logic circuit 10 uses analog/digital converter 30 as a measuring element which ascertains the resulting voltage potential at output portal AP of multiplexer 20 based on criteria which are predefined by sequence control 12. These criteria may include, for example, certain switching states of switches S1 through S6 in the multiplexer or of selection switches S10 through S14 in selection unit 60, as is described in the following with reference to FIGS. 4 through 17. Logic circuit 10 evaluates the resulting voltage potential ascertained at output portal AP of multiplexer 20 based on predefined criteria which are predefined by sequence control 12. These predefined evaluation criteria may, for example, include threshold values, value ranges, etc., with which the ascertained, resulting voltage potentials are compared, as is described in the following with reference to FIGS. 4 through 17. Logic circuit 10 compares the resulting voltage potential ascertained at output portal AP of multiplexer 20 with at least one predefined threshold value and stores the comparison result in memory 50. Upon request, logic circuit 10 outputs the comparison results which are stored in memory 50 via interface unit 40.

Subsequently, an internal short-circuit and coupling test is described as an example with reference to FIGS. 4 through 11 for multiplexer 20 of analog/digital converter system 1 according to the present invention from FIGS. 1 through 3, the test being carried out in logic circuit 10 by implemented sequence control 12. Here, it is tested whether one of channels K1 through Kn of multiplexer 20 has an internal short circuit to another potential and whether multiple channels K1 through Kn of multiplexer 20 are coupled to one another, which may result in unnoticed erroneous measurements. The coupling test runs in two loops which are nested into one another. A differentiation is made between a stimuli channel which applies a predefined voltage potential and a measuring channel which is only used for measuring.

Figure 4:
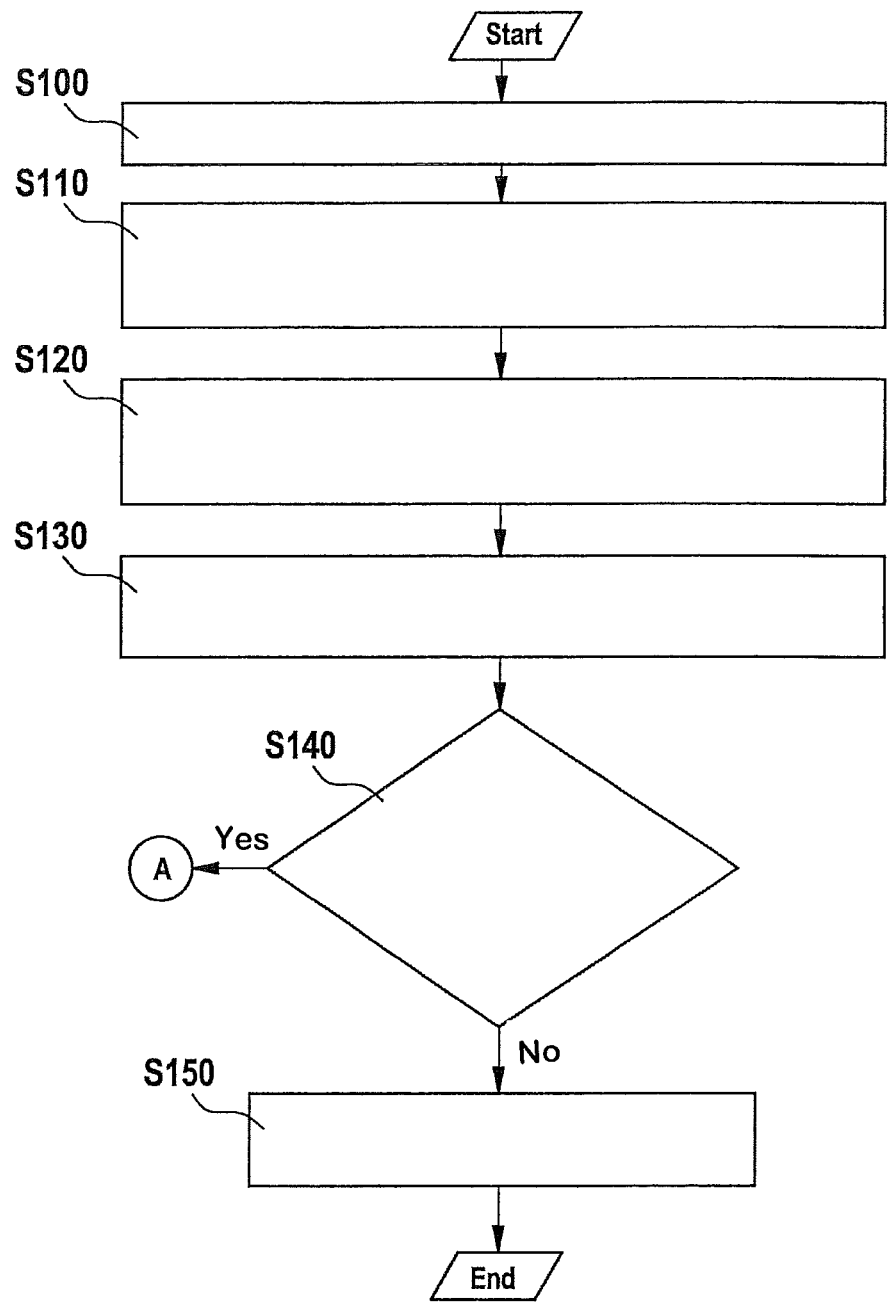
FIGS. 4 through 11 show a schematic flow chart of an internal short-circuit and a coupling test for the multiplexer of the analog/digital converter system according to the present invention from FIGS. 1 through 3.

As is furthermore apparent from FIG. 4, all switches S1 through S6 in multiplexer 20 and all selection switches S10 through S14 in selection unit 60 are opened in step S100 after the activation of the test mode by corresponding control signals which are output by logic circuit 10, for example. In step S110, all channels K1 through Kn of multiplexer 20 are connected to an internal ground potential by closing corresponding second switch S2. In step S120, second selection switch S11 in selection unit 60 is closed in order to connect output portal AP of multiplexer 20 to second reference voltage level $U_{ref2}$, for example. If an interference is not present in multiplexer 20, analog/digital converter 30 converts second reference voltage level $U_{ref2}$ into a digital signal which corresponds to 75% of the maximum digital signal. In step S130, resulting voltage potential $U_T$ is measured at output portal AP of multiplexer 20 with the aid of analog/digital converter 30. In step S140, logic circuit 10 checks whether the measuring result, i.e., resulting voltage potential $U_T$ at output portal AP of multiplexer 20, is within a predefined first value range. For selected second reference voltage level $U_{ref2}$, the digital signal which is output by analog/digital converter 30 and which represents the resulting voltage potential at output portal AP should be in the range from 70% to 80% of the maximum digital signal, for example, in the interference-free case. If the output digital signal is not within the predefined first value range, i.e., the output digital signal is lower than 70% of the maximum digital signal, a first error is stored in memory 50 in step S150, the error stating that switch S4 is short-circuited in at least one channel K1 through Kn of multiplexer 20. The test mode is subsequently terminated. The test result may be output via interface unit 40 upon request. If the output digital signal is within the predefined first value range, sequence control 12 branches via a node A to step S200 in FIG. 5.

Figure 5:
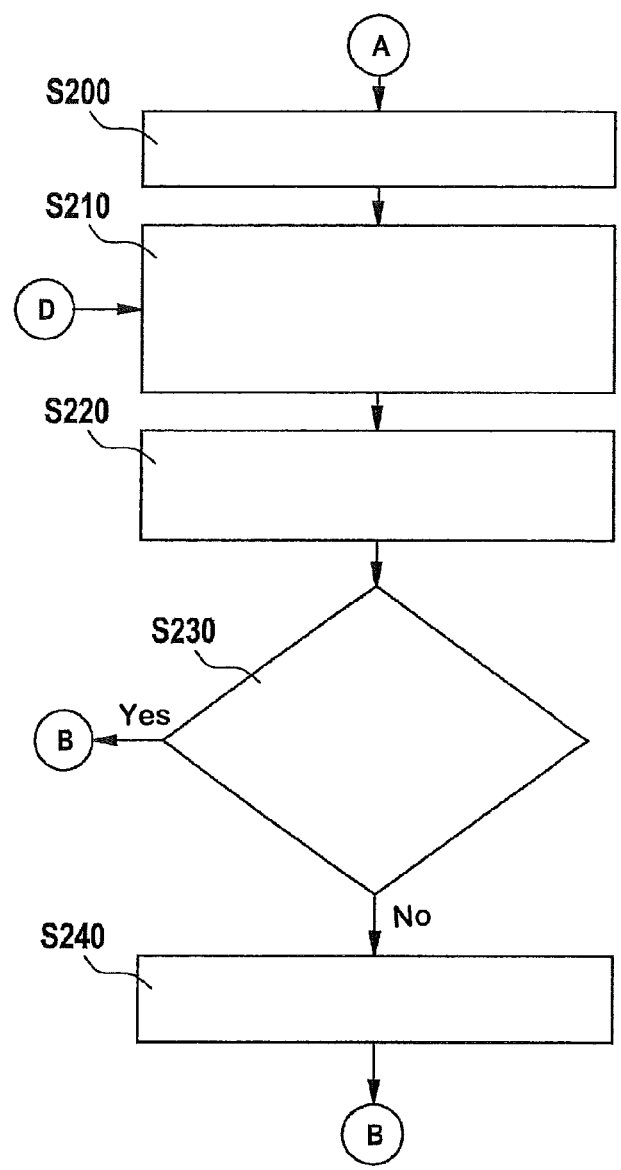

As is furthermore apparent from FIG. 5, first channel K1 of multiplexer 20 is selected as a stimuli channel in step S200. In step S210, the selected stimuli channel is then connected to output portal AP of multiplexer 20 by closing fourth switch S4, and in step S220, resulting voltage potential $U_T$ is measured by analog/digital converter 30 at output portal AP of multiplexer 20. Since the selected stimuli channel is simultaneously connected to the ground potential via second switch S2, a resulting voltage potential $U_T$, whose corresponding digital signal which is output by analog/digital converter 30 is considerably lower than 75% of the maximum digital signal in the interference-free case, must result at output portal AP. In step S230, logic circuit 10 checks whether the measuring result, i.e., resulting voltage potential $U_T$ at output portal AP of multiplexer 20, is within a predefined second value range which includes all digital signals which are, for example, lower than 70% of the maximum digital signal. If the output digital signal is not within the predefined second value range, i.e., the output digital signal is higher than 70% of the maximum digital signal, a second error is stored in memory 50 in step S240, the error stating that second switch S2 or fourth switch S4 in the instantaneous stimuli channel is defective. Subsequently, sequence control 12 branches via a node B to step S250 in FIG. 6. If the output digital signal is within the predefined second value range, sequence control 12 branches via node B directly to step S250 in FIG. 6.

Figure 6:
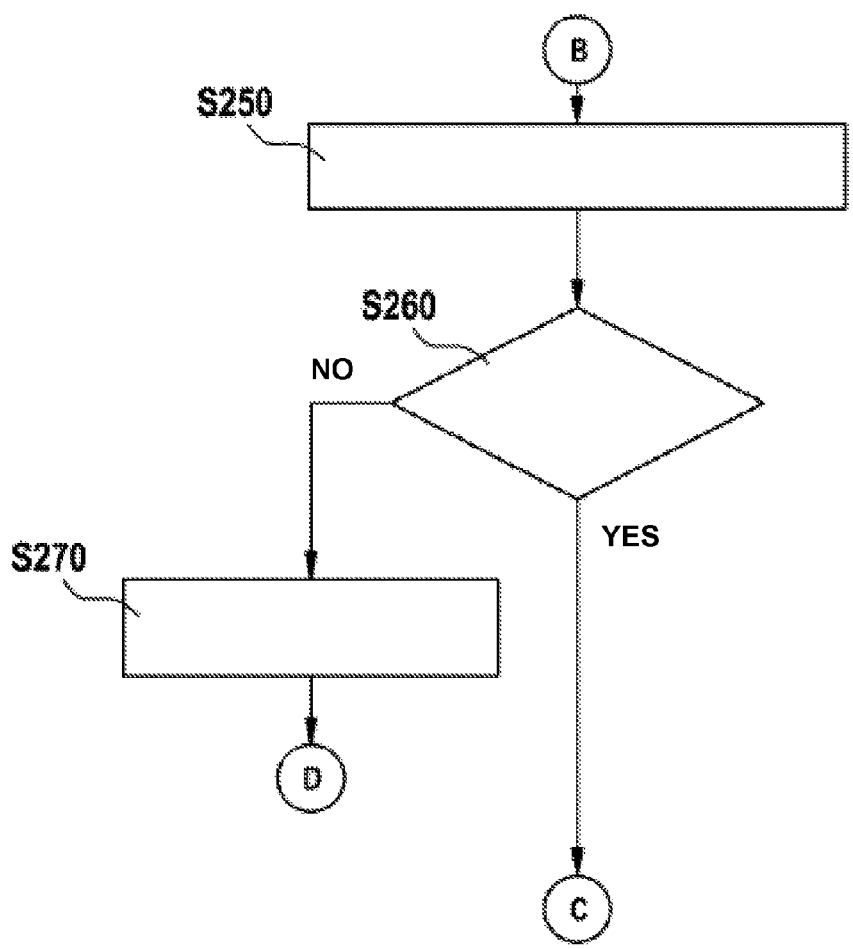

As is furthermore apparent from FIG. 6, the connection of the predefined stimuli channel to output portal AP of multiplexer 20 is opened in step S250 by opening fourth switch S4 in the predefined stimuli channel. Steps S210 through S250 are carried out consecutively for all channels K1 through Kn of multiplexer 20. For this reason, it is checked in step S260 whether all channels K1 through Kn of multiplexer 20 were checked as the stimuli channel. If this is not the case, the next channel of multiplexer 20 is selected as the stimuli channel in step S270. This means that after first channel K1, second channel K2, etc., is selected until last channel Kn of multiplexer 20 has also been checked. After the selection of the next channel in step S270, sequence control 12 branches back to step S210 in FIG. 5 via a node D and repeats steps S210 through S260 for the selected channel. After all channels K1 through Kn of multiplexer 20 have been checked as the stimuli channel, sequence control 12 branches via a node C to step S300 in FIG. 7.

Figure 7:
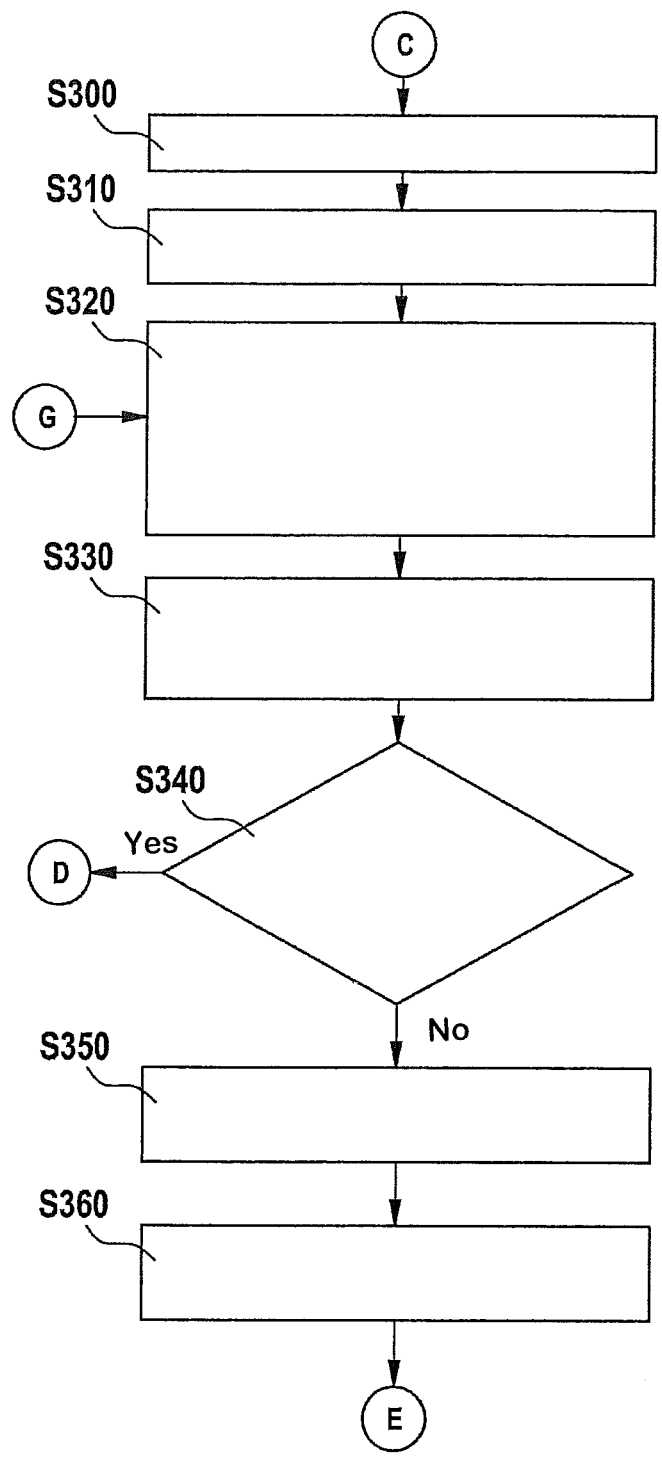

As is furthermore apparent from FIG. 7, all switches S1 through S6 in multiplexer 20 and all selection switches S10 through S14 in selection unit 60 are opened in step S300. In step S310, first channel K1 of multiplexer 20 is selected as the stimuli channel. In step S320, the selected stimuli channel is then connected to an internal voltage potential $U_{int}$, whose value corresponds to first reference voltage level $U_{ref1}$, for example, by closing first switch S1 and it is simultaneously connected to output portal AP of multiplexer 20 by closing fourth switch S4. In step S330, resulting voltage potential $U_T$ is measured at output portal AP of multiplexer 20 by analog/digital converter 30. Since the selected stimuli channel is simultaneously connected to internal voltage potential $U_{int}$ via first switch S1, a resulting voltage potential $U_T$, whose corresponding digital signal which is output by analog/digital converter 30 is higher than 90% of the maximum digital signal in the interference-free case, must result at output portal AP. In step S340, logic circuit 10 checks whether the measuring result, i.e., resulting voltage potential $U_T$ at output portal AP of multiplexer 20, is within a predefined third value range which includes all digital signals which are, for example, higher than 90% of the maximum digital signal. If the output digital signal is not within the predefined third value range, i.e., the output digital signal is lower than 90% of the maximum digital signal, a third error is stored in memory 50 in step S350, the error stating that first switch S1 or fourth switch S4 in the instantaneous stimuli channel is defective. If the second and the third errors occur in the same channel, fourth switch S4 of this channel may be stored as being erroneous. In this case, the connection of the predefined stimuli channel to output portal AP of multiplexer 20 is opened in step S360 by opening fourth switch S4 in the predefined stimuli channel. Subsequently, sequence control 12 branches via a node E to step S370 in FIG. 11. If the output digital signal is within the predefined third value range, sequence control 12 branches via node D to step S400 in FIG. 8.

Figure 8:
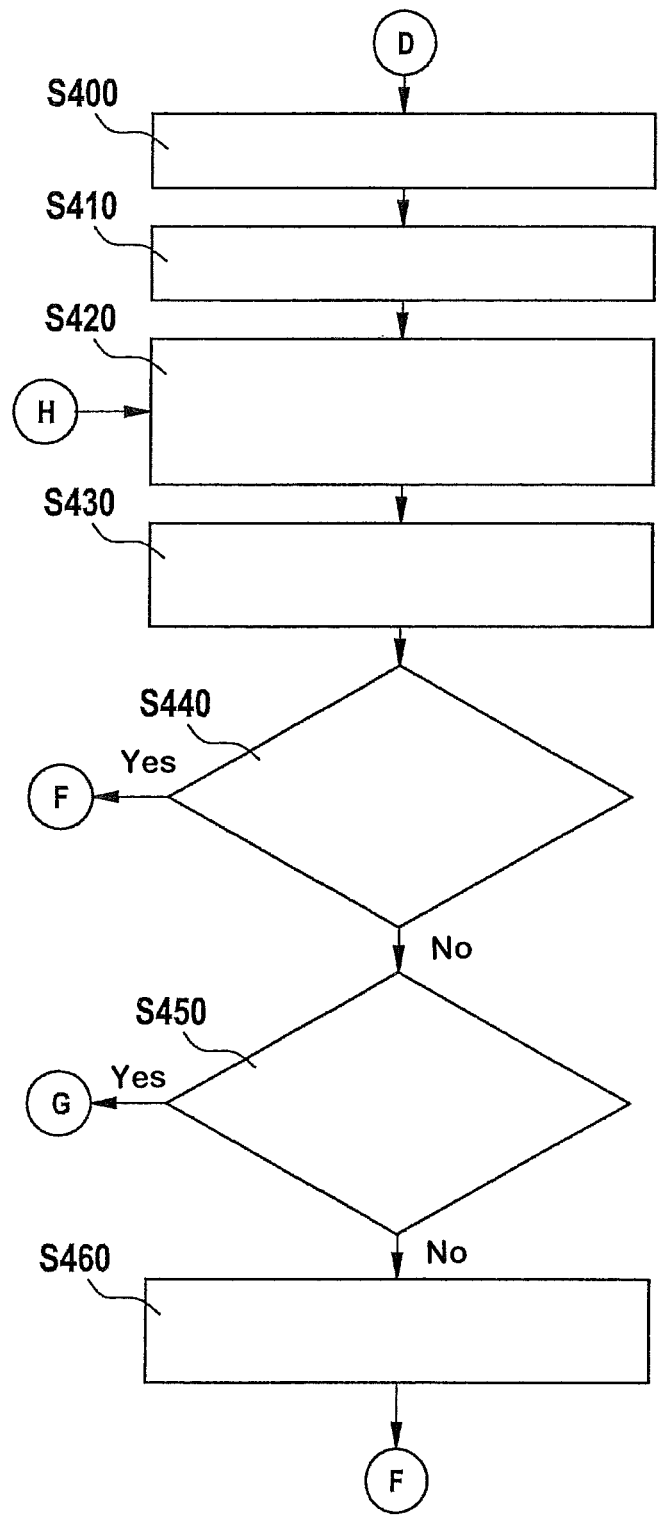

As is furthermore apparent from FIG. 8, the connection of the predefined stimuli channel to output portal AP of multiplexer 20 is opened in step S400 by opening fourth switch S4 in the predefined stimuli channel. In step S410, one of the other channels of multiplexer 20 is selected as the measuring channel. In step S420, the selected measuring channel is then connected to an internal ground potential by closing second switch S2 and it is simultaneously connected to output portal AP of multiplexer 20 by closing fourth switch S4. In step S430, resulting voltage potential $U_T$ is measured at output portal AP of multiplexer 20 by analog/digital converter 30. Since the selected measuring channel is simultaneously connected to the internal ground potential via second switch S2, a resulting voltage potential $U_T$, whose corresponding digital signal which is output by analog/digital converter 30 is lower than 20% of the maximum digital signal in the interference-free case, must result at output portal AP. In step S440, logic circuit 10 checks whether the measuring result, i.e., resulting voltage potential $U_T$ at output portal AP of multiplexer 20, is within a predefined fourth value range which includes all digital signals which are, for example, lower than 20% of the maximum digital signal. If the output digital signal is not within the predefined fourth value range, i.e., the output digital signal is higher than 20% of the maximum digital signal, logic circuit 10 checks in step S450 whether the measuring result, i.e., resulting voltage potential $U_T$ at output portal AP of multiplexer 20, is in a predefined fifth value range which includes all digital signals which are, for example, higher than 30% and lower than 40% of the maximum digital signal. If the output digital signal is not within the predefined fifth value range, a fifth error is stored in memory 50 in step S460, the error stating that second switch S2 or fourth switch S4 in the instantaneous measuring channel is defective. Subsequently, sequence control 12 branches via node F to step S500 in FIG. 10. If the output digital signal is within the predefined fifth value range, sequence control 12 branches via node G to step S470 in FIG. 9. If the output digital signal is within the predefined fourth value range, sequence control 12 branches via node F directly to step S500 in FIG. 10.

Figure 9:
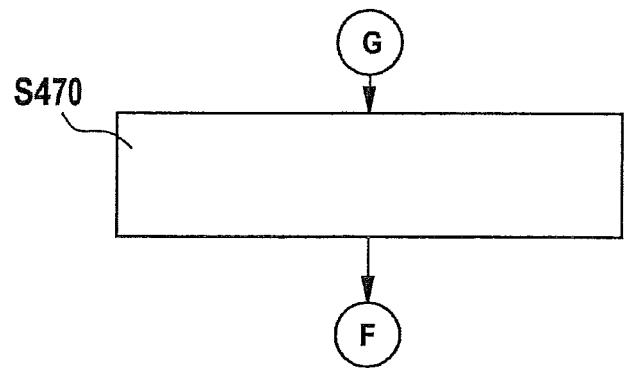

As is furthermore apparent from FIG. 9, a fourth error is stored in memory 50 in step S470, the error stating that the instantaneously checked measuring channel is coupled to the instantaneous stimuli channel. Subsequently, sequence control 12 also branches via node F to step S500 in FIG. 10.

Figure 10:
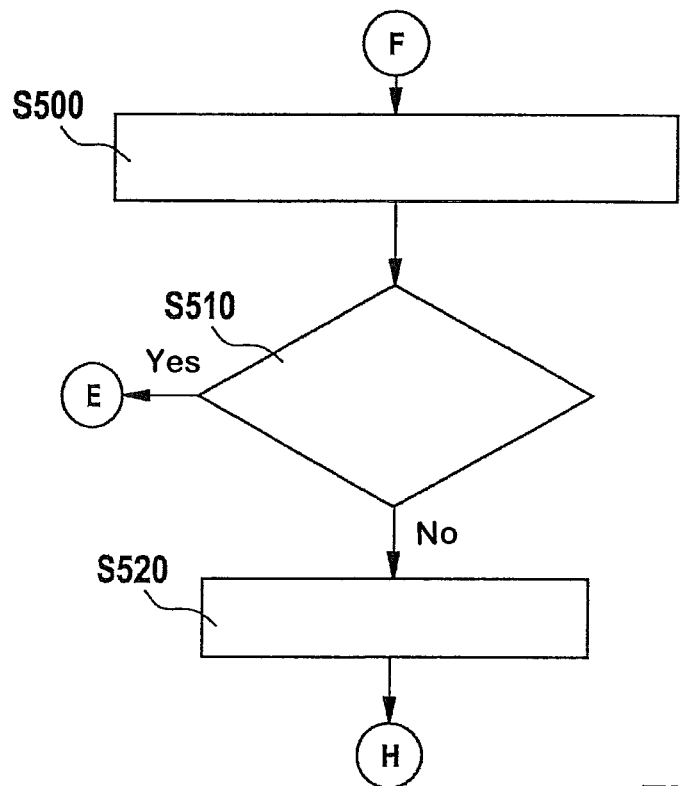

As is furthermore apparent from FIG. 10, all closed switches, i.e., second switch S2 and fourth switch S4, of the instantaneous measuring channel are opened in step S500. In this way, the connection of the predefined measuring channel to output portal AP of multiplexer 20 is opened and the instantaneous measuring channel is disconnected from the ground potential. Steps S420 through S500 are carried out consecutively for all other channels of multiplexer 20, except for the instantaneous stimuli channel. For this reason, it is checked in step S510 whether all other channels of multiplexer 20 were checked as the measuring channel. If this is not the case, the next channel of multiplexer 20 is selected as the measuring channel in step S520. If, for example, first channel K1 is selected as the stimuli channel, then after second channel K2, a third channel K3, etc., is selected as the measuring channel until last channel Kn of multiplexer 20 has also been checked as the measuring channel, with first channel K1 being the stimuli channel. After the selection of the next measuring channel in step S520, sequence control 12 branches back to step S420 in FIG. 8 via a node H and repeats steps S420 through S440 for the selected measuring channel. After all other channels of multiplexer 20 have been checked as the measuring channel for the predefined stimuli channel, sequence control 12 branches via a node E to step S370 in FIG. 11.

Figure 11:
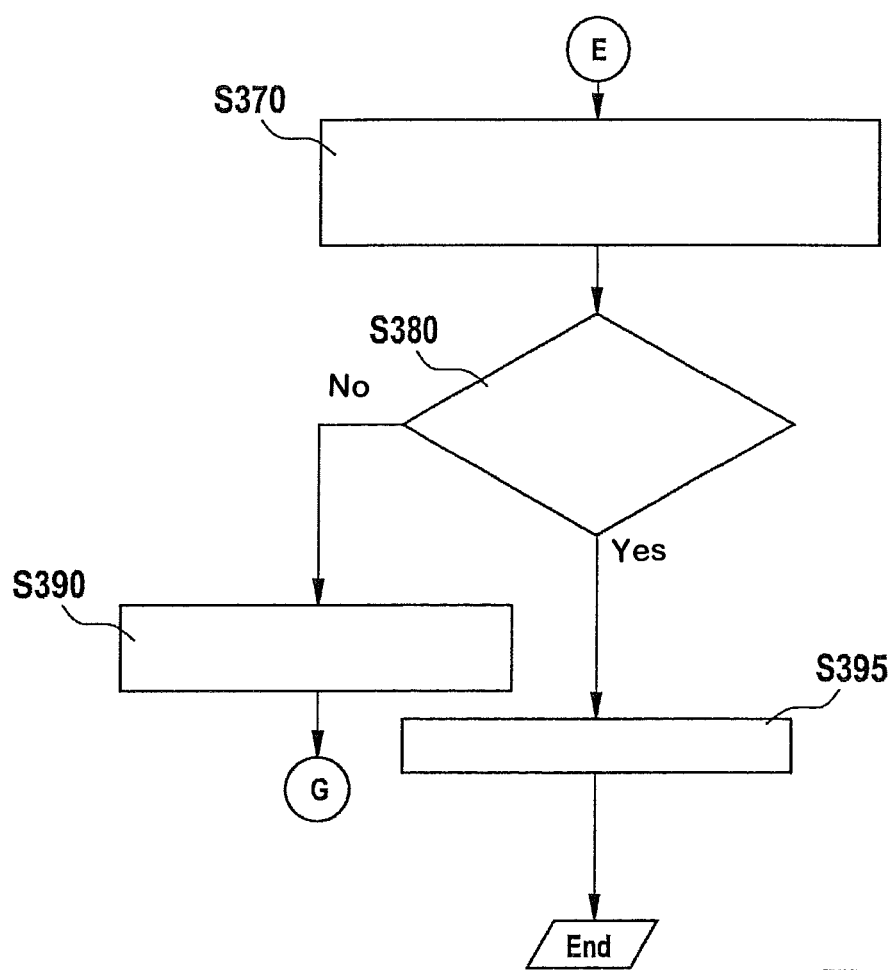

As is furthermore apparent from FIG. 11, the connection of the predefined stimuli channel to internal voltage potential $U_{int}$ of multiplexer 20 is opened in step S370 by opening first switch S1 in the predefined stimuli channel. Steps S220 through S370 are carried out consecutively for all channels K1 through Kn of multiplexer 20. For this reason, it is checked in step S380 whether all channels K1 through Kn of multiplexer 20 were checked as the stimuli channel. If this is not the case, the next channel of multiplexer 20 is selected as the stimuli channel in step S390. This means that after first channel K1, second channel K2, etc., is selected until last channel Kn of multiplexer 20 has also been checked as the stimuli channel. After the selection of the next stimuli channel in step S390, sequence control 12 branches back to step S320 in FIG. 7 via a node G and repeats steps S320 through S370 for the selected stimuli channel. After all channels K1 through Kn of multiplexer 20 have been checked as the stimuli channel, all switches S1 through S6 in multiplexer 20 and all selection switches S10 through S14 in selection unit 60 are opened in step S395 and sequence control 12 terminates the internal short-circuit and coupling tests. The results of the internal short-circuit and coupling tests are stored in memory 50 and may be output via interface unit 40 upon request. In addition to the error states described above, error-free measuring results may also be stored in memory 50.

Subsequently, a coupling test is described as an example with reference to FIGS. 12 through 17 at input portal EP1 through EPn of multiplexer 20 of analog/digital converter system 1 according to the present invention from FIGS. 1 through 3. In this case, an internal port voltage potential $U_P$ may be output via sixth switch S6 at input portal EP1 through EPn of corresponding channel K1 through Kn of multiplexer 20. Internal port voltage potential $U_P$ may, for example, correspond to third reference voltage level $U_{ref3}$. Analogously to the internal coupling measurement, it is possible to now look for external couplings between channels K1 through Kn of multiplexer 20. The test also runs in two loops which are nested into one another, a stimuli channel applying internal port voltage potential $U_P$ via sixth switch S6.

Figure 12:
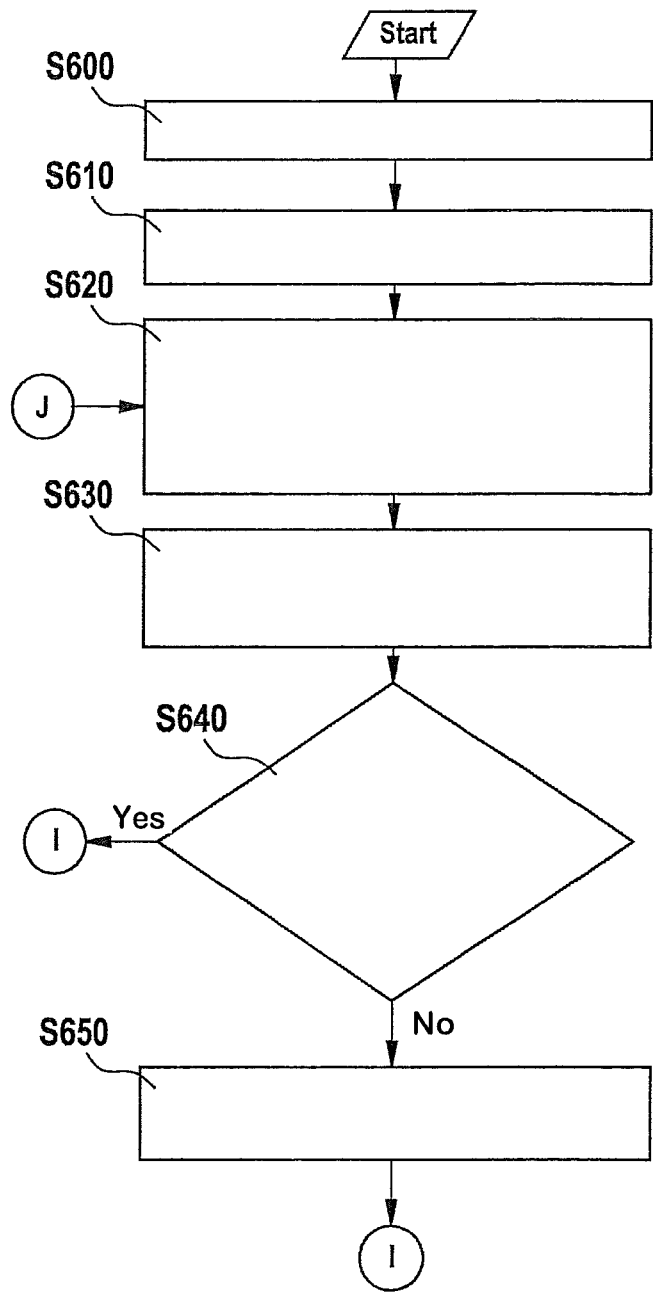
FIGS. 12 through 17 show a schematic flow chart of a coupling test at the input portals of the multiplexer of the analog/digital converter system according to the present invention from FIGS. 1 through 3.

As is furthermore apparent from FIG. 12, all switches S1 through S6 in multiplexer 20 and all selection switches S10 through S14 in selection unit 60 are opened in step S600. In step S610, first channel K1 of multiplexer 20 is selected as the stimuli channel. In step S620, input portal EP1 through EPn of the selected stimuli channel is then connected to output portal AP of multiplexer 20 by closing switches S3, S4, and S5. In step S630, resulting voltage potential $U_T$ is measured at output portal AP of multiplexer 20 by analog/digital converter 30. Since the selected stimuli channel is simultaneously connected to the internal ground potential via fifth switch S5 via resistor R2, a resulting voltage potential $U_T$, whose corresponding digital signal which is output by analog/digital converter 30 is lower than 40% of the maximum digital signal in the interference-free case, must result at output portal AP. In step S640, logic circuit 10 checks whether the measuring result, i.e., resulting voltage potential $U_T$ at output portal AP of multiplexer 20, is within a predefined sixth value range which includes all digital signals which are, for example, lower than 40% of the maximum digital signal. If the output digital signal is not within the predefined sixth value range, i.e., the output digital signal is higher than 40% of the maximum digital signal, a sixth error is then stored in memory 50 in step S650, the error stating that the instantaneous stimuli channel has a short circuit to a voltage potential. Subsequently, sequence control 12 branches via a node I to step S660 in FIG. 13. If the output digital signal is within the predefined sixth value range, sequence control 12 branches via node I directly to step S660 in FIG. 13.

Figure 13:
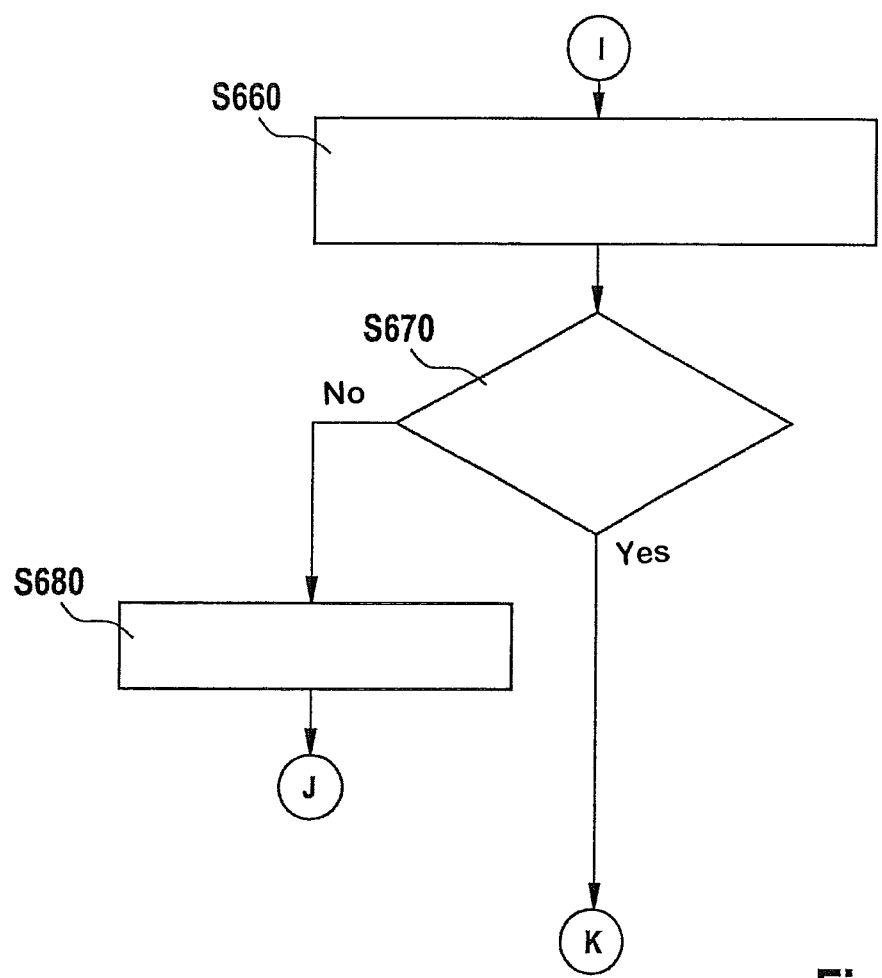

As is furthermore apparent from FIG. 13, all closed switches, i.e., third switch S3, fourth switch S4, and fifth switch S5, of the instantaneous stimuli channel are opened in step S660. In this way, the connection of input portal EP1 through EPn of the predefined stimuli channel is separated again from output portal AP of multiplexer 20. Steps S620 through S660 are carried out consecutively for all channels K1 through Kn of multiplexer 20. For this reason, it is checked in step S670 whether all channels K1 through Kn of multiplexer 20 were checked as the stimuli channel. If this is not the case, the next channel of multiplexer 20 is selected as the stimuli channel in step S680. After the selection of the next stimuli channel in step S680, sequence control 12 branches back to step S620 in FIG. 12 via a node J and repeats steps S620 through S660 for the selected stimuli channel. After all channels K1 through Kn of multiplexer 20 have been checked as the stimuli channel, sequence control 12 branches via a node K to step S700 in FIG. 14.

Figure 14:
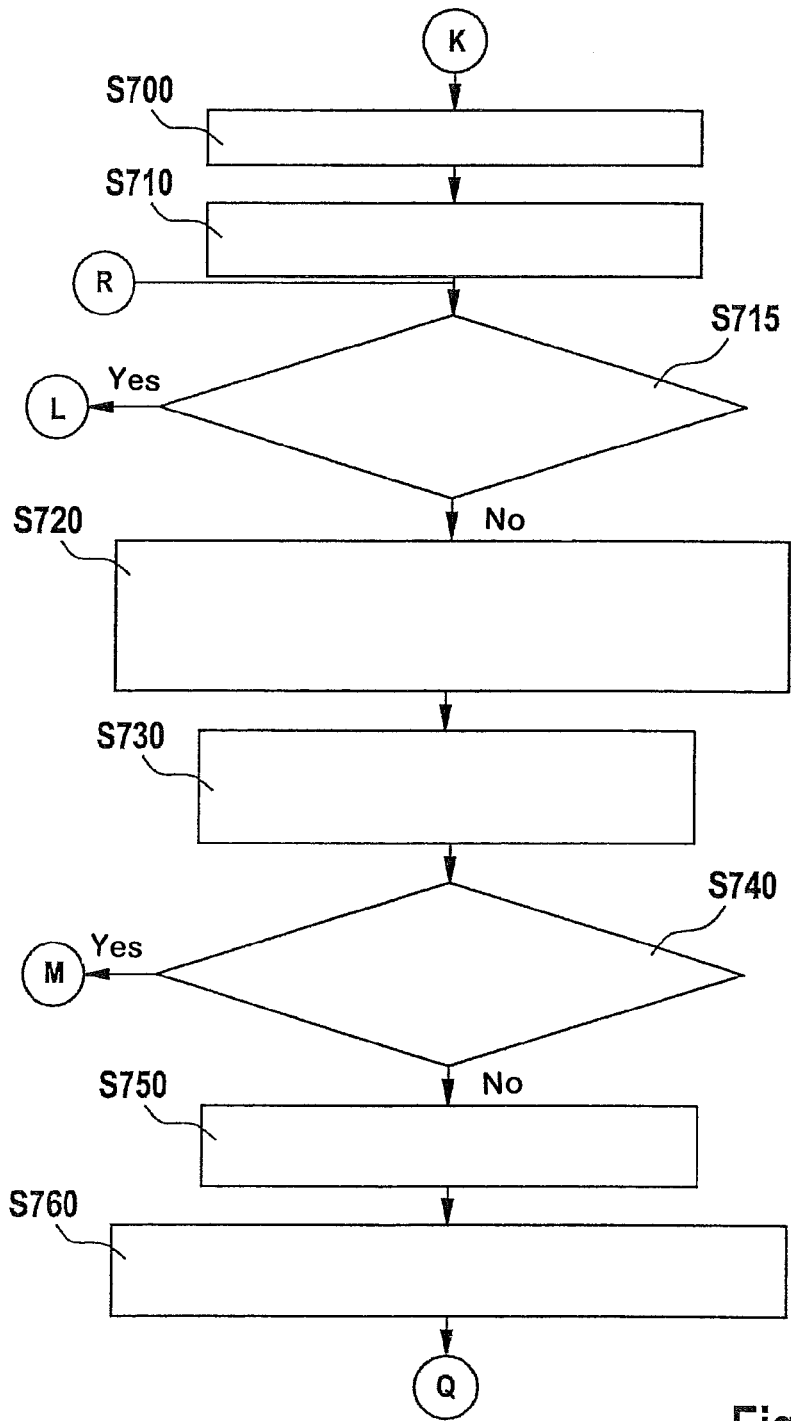

As is furthermore apparent from FIG. 14, all switches S1 through S6 in multiplexer 20 and all selection switches S10 through S14 in selection unit 60 are opened in step S700. In step S710, first channel K1 of multiplexer 20 is selected as the stimuli channel. In step S715, it is then checked whether the selected stimuli channel has a short circuit to a voltage potential, i.e., the sixth error. If the stimuli channel has the sixth error, sequence control 12 branches via a node L to step S780 in FIG. 17. If the stimuli channel does not have the sixth error, input portal EP1 through EPn of the selected stimuli channel is then connected in step S720 to output portal AP of multiplexer 20 by closing switches S3, S4, and S5. At the same time, input portal EP1 through EPn of the selected stimuli channel is connected to port voltage potential $U_P$ whose value corresponds to third reference voltage level $U_{ref3}$, for example, by closing sixth switch S6. In step S730, resulting voltage potential $U_T$ is measured at output portal AP of multiplexer 20 by analog/digital converter 30.

Since port voltage potential $U_P$ corresponds to approximately 50% of the maximum digital signal, a resulting voltage potential $U_T$, whose corresponding digital signal which is output by analog/digital converter 30 is higher than 40% of the maximum digital signal in the interference-free case, must result at output portal AP. In step S740, logic circuit 10 checks whether the measuring result, i.e., resulting voltage potential $U_T$ at output portal AP of multiplexer 20, is within a predefined seventh value range which includes all digital signals which are, for example, higher than 40% of the maximum digital signal. If the output digital signal is not within the predefined third value range, i.e., the output digital signal is lower than 40% of the maximum digital signal, a seventh error is stored in memory 50 in step S750, the error stating that the instantaneous stimuli channel has a short circuit to ground. In this case, the connection of input portal EP1 through EPn of the predefined stimuli channel to output portal AP of multiplexer 20 is opened in step S760 by opening switches S3, S4, and S5 in the predefined stimuli channel. Subsequently, sequence control 12 branches via a node Q to step S770 in FIG. 17. If the output digital signal is within the predefined seventh value range, sequence control 12 branches via node M to step S800 in FIG. 15.

Figure 15:
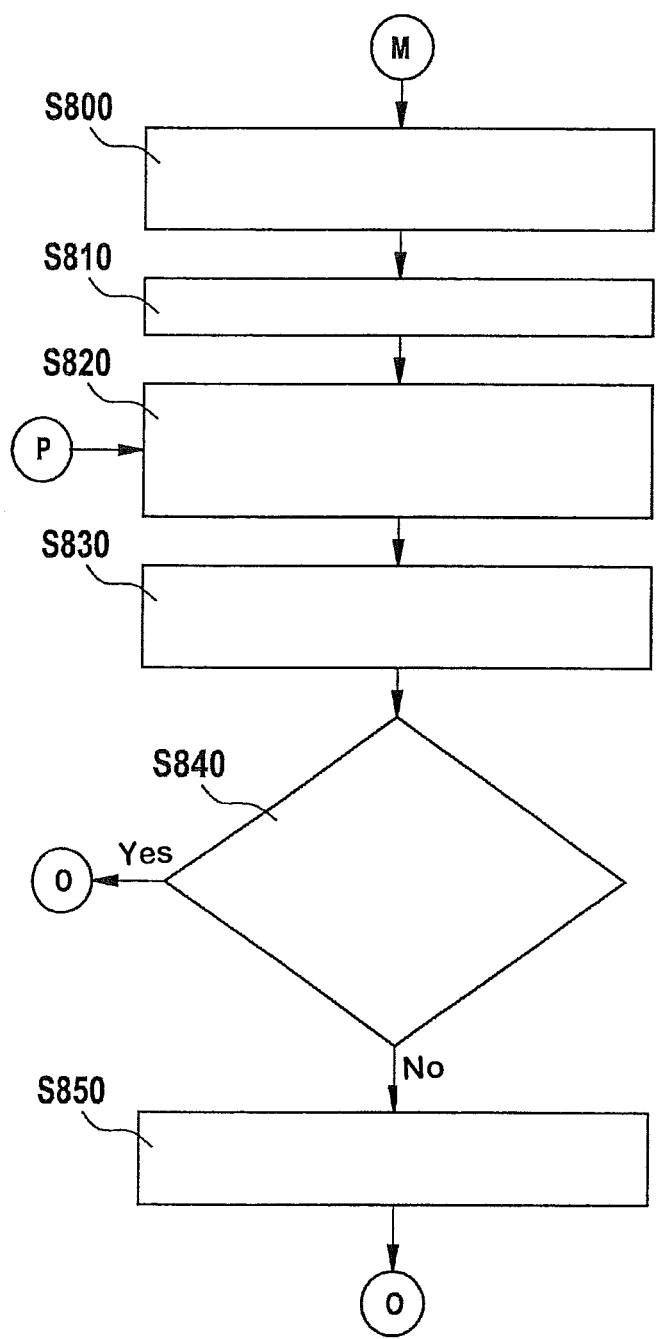

As is furthermore apparent from FIG. 15, the connection of input portal EP1 through EPn of the predefined stimuli channel to output portal AP of multiplexer 20 is opened in step S800 by opening switches S3, S4, and S5 in the predefined stimuli channel. In step S810, one of the other channels of multiplexer 20 is selected as the measuring channel. In step S820, input portal EP1 through EPn of the selected measuring channel is then connected to output portal AP of multiplexer 20 by closing switches S3, S4, and S5. In step S830, resulting voltage potential $U_T$ is measured at output portal AP of multiplexer 20 by analog/digital converter 30. Since the selected measuring channel is simultaneously connected to the internal ground potential via fifth switch S5 via resistor R2, a resulting voltage potential $U_T$, whose corresponding digital signal which is output by analog/digital converter 30 is lower than 40% of the maximum digital signal in the interference-free case, must result at output portal AP. In step S840, logic circuit 10 checks whether the measuring result, i.e., resulting voltage potential $U_T$ at output portal AP of multiplexer 20, is within a predefined eighth value range which includes all digital signals which are, for example, lower than 40% of the maximum digital signal. If the output digital signal is not within the predefined eighth value range, i.e., the output digital signal is higher than 40% of the maximum digital signal, an eighth error is stored in memory 50 in step S850, the error stating that the instantaneous measuring channel is coupled to the instantaneous stimuli channel. Subsequently, sequence control 12 branches via node O to step S860 in FIG. 16. If the output digital signal is within the predefined eighth value range, sequence control 12 branches via node O directly to step S860 in FIG. 16.

Figure 16:
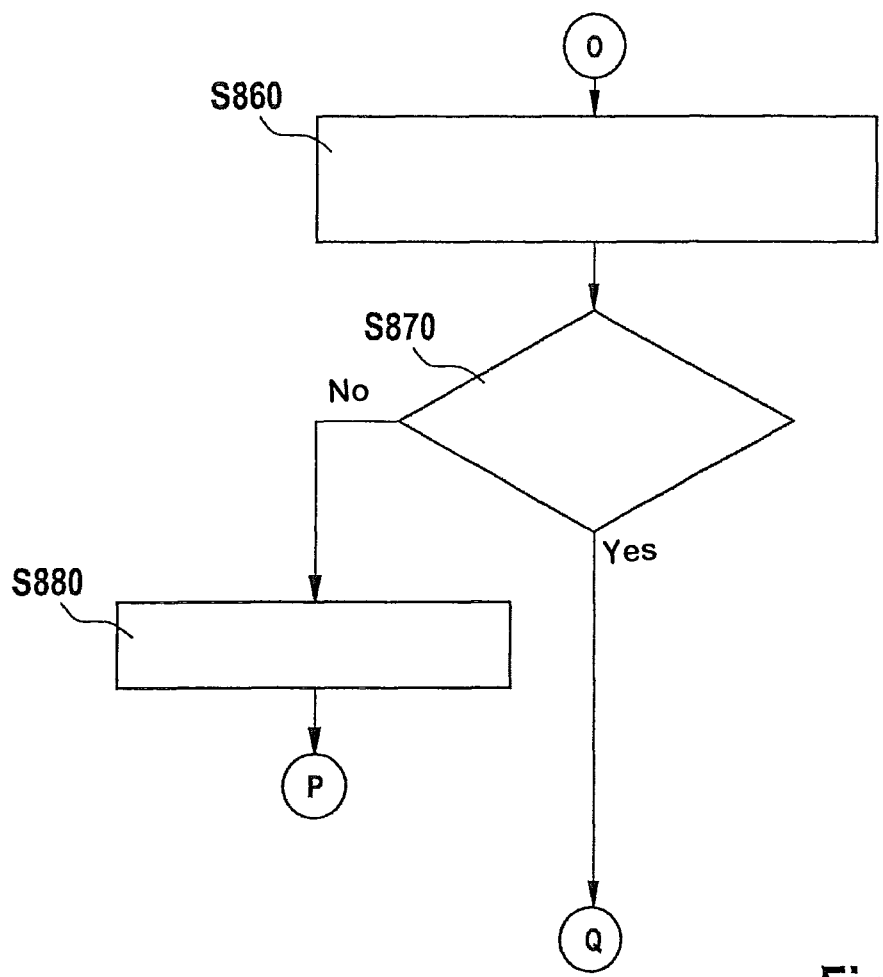

As is furthermore apparent from FIG. 16, all closed switches, i.e., third switch S3, fourth switch S4, and fifth switch S5, of the instantaneous measuring channel are opened in step S860. In this way, the connection of input portal EP1 through EPn of the predefined measuring channel is opened to output portal AP of multiplexer 20. Steps S820 through S860 are carried out consecutively for all other channels of multiplexer 20, except for the instantaneous stimuli channel. For this reason, it is checked in step S870 whether all other channels of multiplexer 20 were checked as the measuring channel. If this is not the case, the next channel of multiplexer 20 is selected as the measuring channel in step S880. After the selection of the next measuring channel in step S880, sequence control 12 branches back to step S820 in FIG. 15 via a node P and repeats steps S820 through S860 for the selected measuring channel. After all other channels of multiplexer 20 have been checked as the measuring channel for the predefined stimuli channel, sequence control 12 branches via a node Q to step S770 in FIG. 17.

Figure 17:
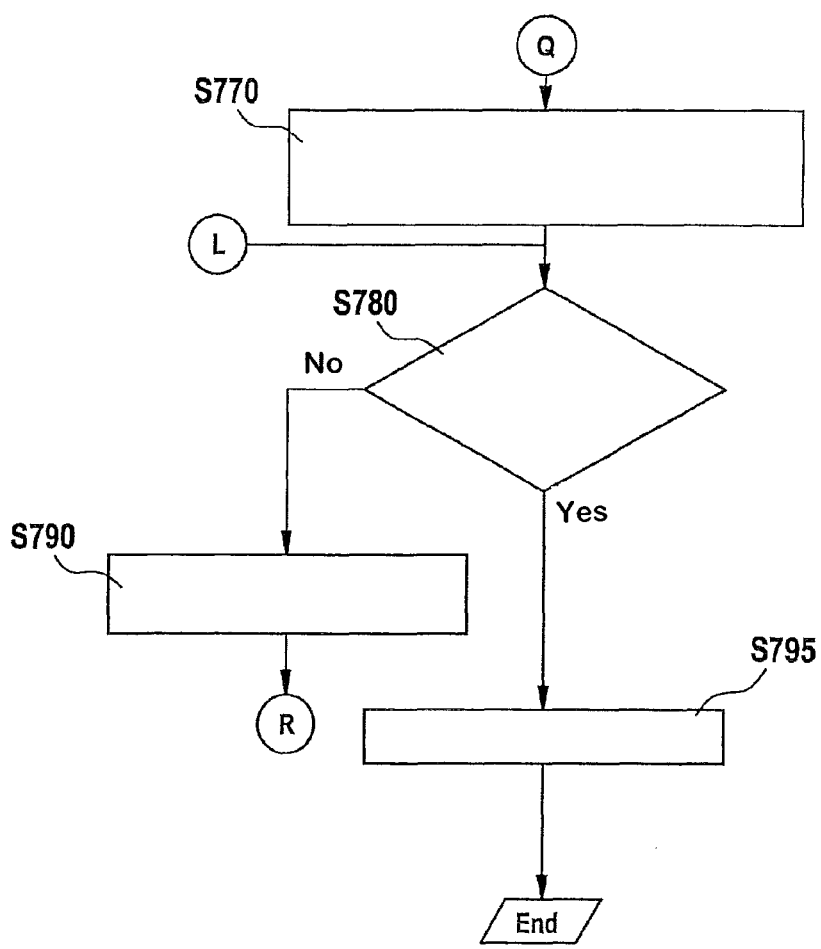

As is furthermore apparent from FIG. 17, the connection of input portal EP1 through EPn of the predefined stimuli channel to internal port voltage potential $U_P$ of multiplexer 20 is opened in step S770 by opening sixth switch S6 in the predefined stimuli channel. Steps S715 through S770 are carried out consecutively for all channels K1 through Kn of multiplexer 20. For this reason, it is checked in step S780 whether all channels K1 through Kn of multiplexer 20 were checked as the stimuli channel. If this is not the case, the next channel of multiplexer 20 is selected as the stimuli channel in step S790. After the selection of the next stimuli channel in step S790, sequence control 12 branches back to step S715 in FIG. 14 via a node R and repeats steps S715 through S770 for the selected stimuli channel. After all channels K1 through Kn of multiplexer 20 have been checked as the stimuli channel, all switches S1 through S6 in multiplexer 20 and all selection switches S10 through S14 in selection unit 60 are opened in step S795 and sequence control 12 terminates the coupling tests at input portal EP1 through EPn of multiplexer 20. The results of the coupling tests at input portal EP1 through EPn of multiplexer 20 are stored in memory 50 and may be output via interface unit 40 upon request. In addition to the error states described above, error-free measuring results may also be stored in memory 50.

Since all tests run automatically after the initiation through the software automatically, the control device or a microcontroller in the control device is not affected by the test mode of analog/digital converter system 1 and is able to process other processes during this time. After the automatic test mode has been terminated, the measuring results may be retrieved if necessary.

Specific embodiments of the present invention provide an analog/digital converter system and a method for checking a multiplexer for an analog/digital converter which are able to detect possible errors in the multiplexer, such as short circuits to another potential, a coupling of multiple channels among one another, or an interruption of the channel during an automatic test mode, so that the analog/digital converter system according to the present invention may be used to detect or measure and process safety-relevant variables. The automatic test mode may be activated via a software instruction which is received by the automatically running sequence control which activates and evaluates the individual testing conditions. The result of the check may then be requested via a corresponding software instruction.

What is claimed is:

1. An analog/digital converter system, comprising:
   a multiplexer which includes multiple channels that each has at least one first switch, the respective at least one first switch being configured to connect an input portal of the respective channel to an output portal of the multiplexer; and
   an analog/digital converter, an analog input of which is connected to the output portal of the multiplexer;
   wherein:
      for testing the multiplexer with respect to respective ones of the multiple channels, the system includes at least one second switch that is configured to connect a predefined voltage potential to at least one of (a) the respective channel, (b) the input portal of the respective channel, and (c) the output portal; and
      the system is configured to consecutively operate respective ones of the multiple channels as a stimuli channel while operating the remaining channels as measuring channels.

2. The analog/digital converter system of claim 1, further comprising:
   a logic circuit to switch the at least one first switch and the at least one second switch, wherein in the logic circuit, a sequence control is implemented to check individual ones of the multiple channels in a predefined sequence by activating respective ones of the switches to the effect as to whether a particular one of the channels has an internal and/or an external short circuit to another voltage potential and/or is coupled to another channel.

3. The analog/digital converter system of claim 2, wherein the at least one second switch is switchable in a test mode and the sequence control is activated in the logic circuit during the test mode.

4. The analog/digital converter system of claim 3, further comprising an interface unit for interfacing with to a control device to receive at least one instruction from the control device to carry out the test mode and/or to output and relay to the logic circuit a result of the test mode.

5. The analog/digital converter system of claim 4, wherein the system is configured for the interface unit to receive the instruction to carry out the test mode in the case of every start-up of the overall system.

6. The analog/digital converter system of claim 2, wherein the logic circuit uses the analog/digital converter as a measuring element to ascertain a resulting voltage potential at the output portal of the multiplexer based on criteria which are predefined by the sequence control.

7. The analog/digital converter system of claim 6, wherein the logic circuit is configured to evaluate the resulting voltage potential ascertained at the output portal of the multiplexer based on predefined criteria which are predefined by the sequence control.

8. The analog/digital converter system of claim 7, wherein the logic circuit is configured to compare the resulting voltage potential ascertained at the output portal of the multiplexer with at least one predefined threshold value and stores a result of the comparison in at least one memory.

9. The analog/digital converter system of claim 8, wherein the logic circuit is configured to output the comparison result which is stored in the at least one memory upon request.

10. The analog/digital converter system of claim 1, further comprising:
    a voltage supply and a selection unit to provide at least one predefined external voltage potential.

11. A method for checking a multiplexer for an analog/digital converter system, the multiplexer including multiple channels that each has at least one first switch, the method comprising:
    for each of at least one of the multiple channels, connecting, using the at least one first switch of the respective channel, an input portal of the respective channel to an output portal of the multiplexer; and
    connecting, using at least one second switch of the analog/digital converter system, a predefined voltage potential to at least one of (a) the respective channel, (b) the input portal of the respective channel, and (c) the output portal;
    wherein the connecting is performed in an operation in which respective ones of the multiple channels are consecutively operated as a stimuli channel while the remaining channels are operated as measuring channels.

12. The method of claim 11, wherein a sequence control is implemented to check individual ones of the multiple channels in a predefined sequence by activating respective ones of the switches to the effect as to whether a particular one of the channels has an internal and/or an external short circuit to another voltage and/or is coupled to another channel.

13. The method of claim 12, wherein the at least one second switch is switched in a test mode and the sequence control is activated during the test mode.

* * * * *